United States Patent
Xie et al.

(10) Patent No.: US 9,312,388 B2
(45) Date of Patent: Apr. 12, 2016

(54) METHODS OF FORMING EPITAXIAL SEMICONDUCTOR MATERIAL IN TRENCHES LOCATED ABOVE THE SOURCE AND DRAIN REGIONS OF A SEMICONDUCTOR DEVICE

(71) Applicant: GLOBALFOUNDRIES Inc., Grand Cayman (KY)

(72) Inventors: Ruilong Xie, Niskayuna, NY (US); Hoon Kim, Clifton Park, NY (US); Chanro Park, Clifton Park, NY (US); Min Gyu Sung, Latham, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/267,216

(22) Filed: May 1, 2014

(65) Prior Publication Data

US 2015/0318398 A1 Nov. 5, 2015

(51) Int. Cl.
*H01L 29/66* (2006.01)
*H01L 29/78* (2006.01)
*H01L 29/08* (2006.01)

(52) U.S. Cl.
CPC ........ *H01L 29/7851* (2013.01); *H01L 29/0847* (2013.01); *H01L 29/6656* (2013.01); *H01L 29/66636* (2013.01); *H01L 29/66795* (2013.01); *H01L 29/78* (2013.01)

(58) Field of Classification Search
None
See application file for complete search history.

(56) References Cited

U.S. PATENT DOCUMENTS

| | | | |
|---|---|---|---|
| 9,153,694 B2 * | 10/2015 | Xie | H01L 29/785 |
| 2011/0193141 A1 * | 8/2011 | Lin et al. | 257/255 |
| 2011/0241071 A1 * | 10/2011 | Shin | H01L 29/6653 257/190 |
| 2014/0065782 A1 * | 3/2014 | Lu et al. | 438/294 |
| 2015/0206956 A1 * | 7/2015 | Kim et al. | H01L 29/66795 |
| 2015/0279972 A1 * | 10/2015 | Xie | H01L 29/66795 438/283 |

* cited by examiner

*Primary Examiner* — Marc Armand
*Assistant Examiner* — Younes Boulghassoul
(74) *Attorney, Agent, or Firm* — Amerson Law Firm, PLLC

(57) ABSTRACT

One method disclosed includes, among other things, forming a gate structure above an active region of a semiconductor substrate, wherein a first portion of the gate structure is positioned above the active region and second portions of the gate structure are positioned above an isolation region formed in the substrate, forming a sidewall spacer adjacent opposite sides of the first portion of the gate structure so as to define first and second continuous epi formation trenches comprised of the spacer that extend for less than the axial length of the gate structure, and forming an epi semiconductor material on the active region within each of the first and second continuous epi formation trenches.

20 Claims, 15 Drawing Sheets

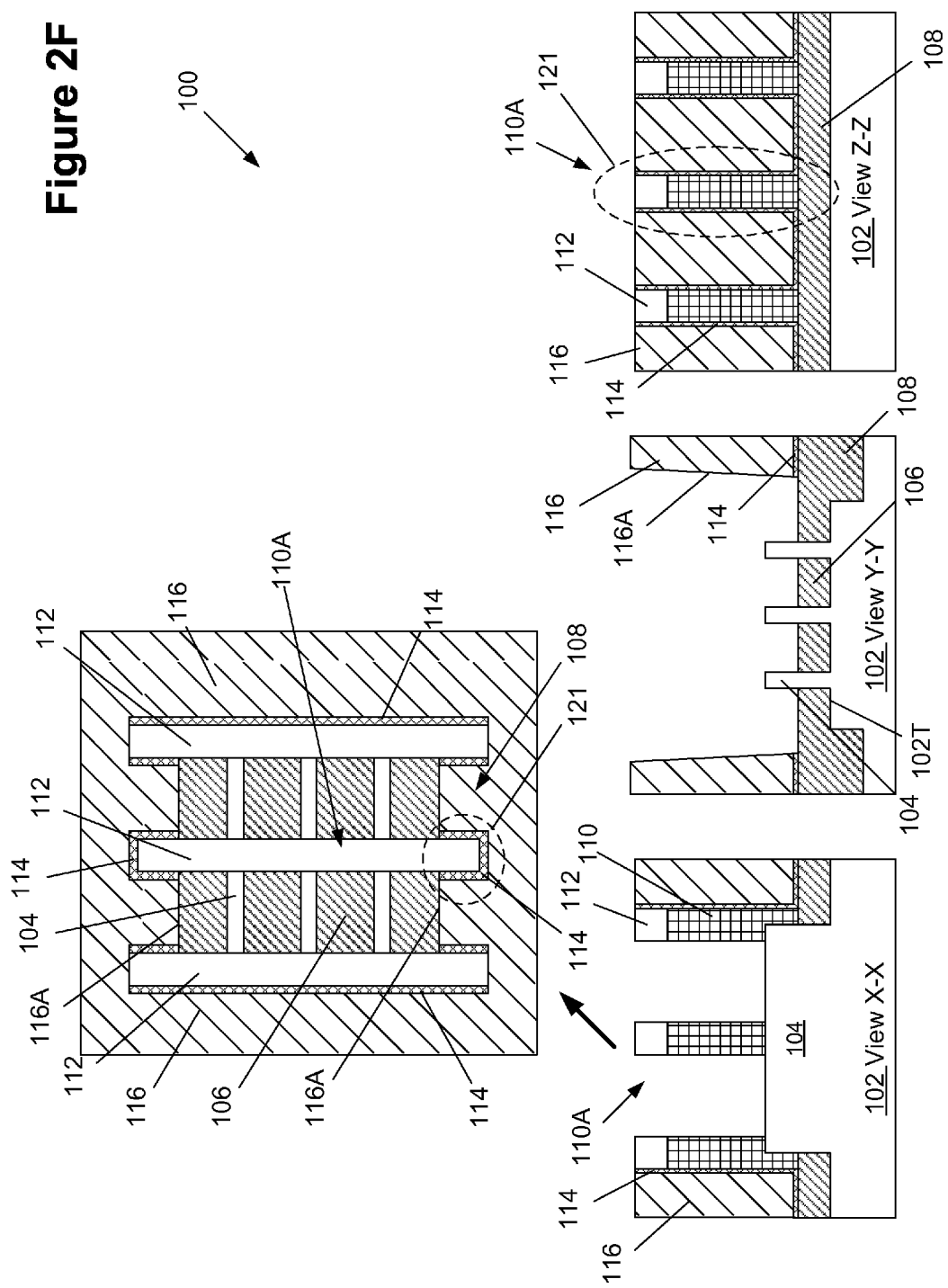

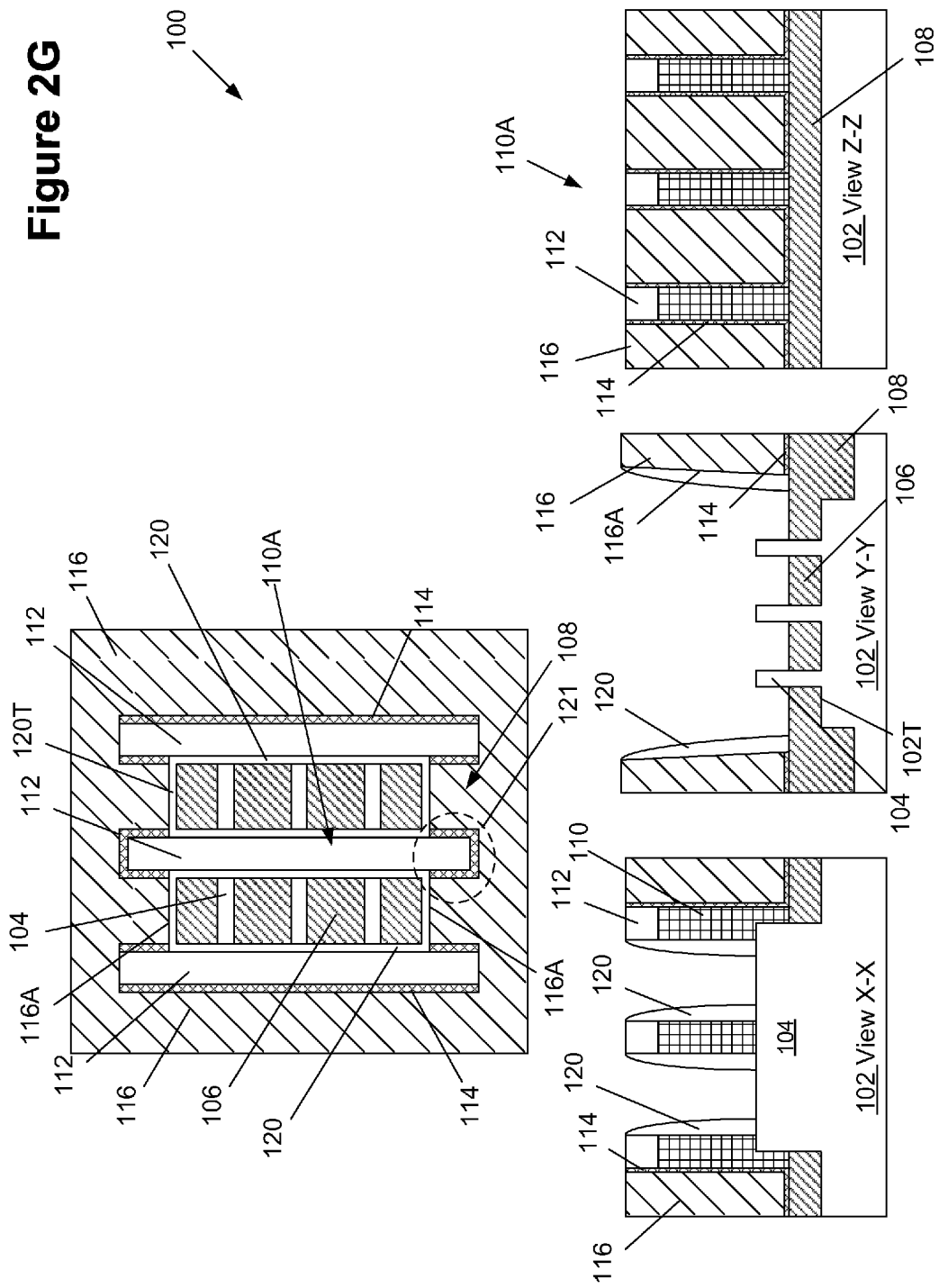

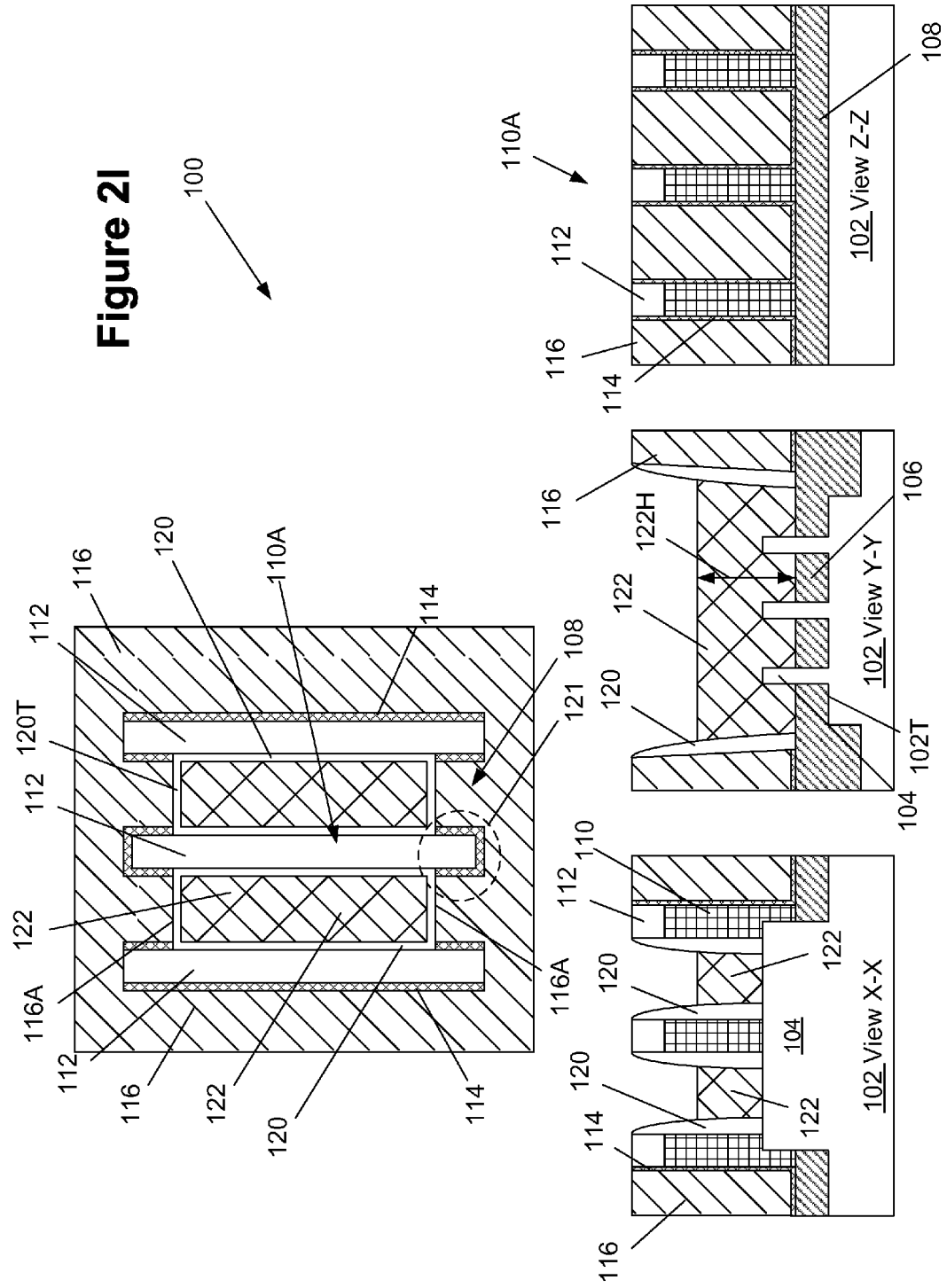

METHODS OF FORMING EPITAXIAL SEMICONDUCTOR MATERIAL IN TRENCHES LOCATED ABOVE THE SOURCE AND DRAIN REGIONS OF A SEMICONDUCTOR DEVICE

BACKGROUND OF THE INVENTION

1. Field of the Invention

The present disclosure generally relates to the fabrication of integrated circuits, and, more particularly, to various methods of forming an epi semiconductor material in trenches formed above a semiconductor device and the resulting semiconductor devices.

2. Description of the Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as FinFET devices.

A field effect transistor (FET), irrespective of whether an NMOS transistor or a PMOS transistor is considered, and irrespective of whether it is a planar or 3D FinFET device, typically comprises doped source/drain regions that are formed in a semiconductor substrate that are separated by a channel region. A gate insulation layer is positioned above the channel region and a conductive gate electrode is positioned above the gate insulation layer. The gate insulation layer and the gate electrode may sometimes be referred to as the gate structure for the device. The gate structures for both planar and FinFET devices may be manufactured using so-called "gate-first" or "replacement gate" (gate-last) manufacturing techniques. By applying an appropriate voltage to the gate electrode, the channel region becomes conductive and current is allowed to flow from the source region to the drain region. In a planar FET device, the gate structure is formed above a substantially planar upper surface of the substrate. In some cases, one or more epitaxial growth processes are performed to form epi semiconductor material in recesses formed in the source/drain regions of the planar FET device. In some cases, the epi material may be formed in the source/drain regions without forming any recesses in the substrate for a planar FET device. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

FIG. 1A is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap F. The gate structure D is typically comprised of a layer of insulating material (not separately shown), e.g., a layer of high-k insulating material or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D is the channel region of the FinFET device A. In a conventional process flow, the portions of the fins C that are positioned outside of the spacers E, i.e., in the source/drain regions of the device A, may be increased in size or even merged together (a situation not shown in FIG. 1A) by performing one or more epitaxial growth processes. The process of increasing the size of or merging the fins C in the source/drain regions of the device A is performed to reduce the resistance of source/drain regions and/or make it easier to establish electrical contact to the source/drain regions. Even if an epi "merger" process is not performed, an epi growth process will typically be performed on the fins C to increase their physical size.

In some cases, damage to the fin structures in the source/drain regions of the device may not be a significant concern, i.e., an application in which there may be significant growth of epi material in the source/drain regions. Nevertheless, even in those situations, problems can occur if too much of the epi material is grown in the source/drain regions of the device; e.g., epi-to-epi shorting between adjacent devices or around the end of the gate structure on a single device.

Another area of potential concern is related to the formation of so-called self-aligned contacts. The typical process flow for forming such contacts involves forming an opening in a layer of silicon dioxide that is supposed to stop on a silicon nitride gate cap layer and a silicon nitride sidewall spacer (that are formed to protect the gate materials). Unfortunately, there is a risk of consuming too much of the gate cap layer and/or the sidewall spacer during the contact opening etching process which can lead to exposure of the gate materials. When the contact is formed in the contact opening, there is a chance of creating a contact-to-gate electrical short due to the loss of the cap and/or spacer material.

FIG. 1B is a simplistic plan view of an illustrative transistor device (which can be either a planar or FinFET device). As depicted, the transistor is comprised of source and drain regions that are formed in an active region surrounded by isolation material, typically silicon dioxide. The gate structure ("gate") of the device is formed above the active region and one or more sidewall spacers are formed adjacent the gate structure using a variety of known processing techniques. Typically the spacers are formed by conformably depositing a layer of spacer material, e.g., silicon nitride, and thereafter performing an anisotropic etching process. Note that the spacer is formed around the entire perimeter of the gate structure and that the spacer is formed with the intent that it has a substantially uniform thickness at all locations around the perimeter of the gate structure.

Unfortunately, as device dimensions have decreased and packing densities have increased, the formation of epi semiconductor material in the source/drain regions of the device may lead to several problems. For example, since the epi material tends to grow in both the vertical and lateral directions (albeit sometimes not at the same rate in each direction), there is a chance that some of the epi material may form in regions where it should not be located. The extent and amount of undesirable epi semiconductor material formation will vary depending upon the particular application and the quality of the manufacturing processes used to manufacture the device. In a worst case scenario, this undesirable epi semiconductor material may form around the entire end surface of a particular gate electrode so as to effectively from a conductive "bridge" between one or both of the source/drain regions and the gate electrode. In another example, such undesirable epi semiconductor material may span the space between the opposing end surfaces of two spaced-apart gate electrode structures, wherein the epi material may form on one or both of the spaced-apart gate structures. In another example, the epi semiconductor material may bridge the space between spaced-apart active regions and contact other epi material formed on the adjacent device. As a result of such undesirable and unpredictable epi formation, the resulting semiconductor devices and the integrated circuits including such devices may completely fail or operate at less than acceptable performance levels.

One solution that manufacturers have adopted to try to limit such problems with epi material growth is to limit the thickness or height of the epi semiconductor material. However, this proposed remedy has several drawbacks. First, limiting the thickness of the epi material necessarily reduces the total volume of the epi material that is formed. Metal silicide regions are typically formed on such epi material to reduce the contact resistance for a contact that is to be formed to contact the source/drain regions. During the metal silicide formation process, some of the epi material is consumed. Thus, limiting the thickness of the epi material can lead to a situation where very little of the epi material is left after the metal silicide regions are formed. This can position the bottom of the metal silicide region very near the upper surface of the substrate or fin, which can undesirably increase the contact resistance.

Additionally, there are inherent issues with the prior art techniques used to form epi material on the source/drain regions. For example, in one prior art process flow, spacers are formed adjacent a gate structure, a layer of oxide material is formed between adjacent gate structures and a CMP process is performed on the oxide material. Thereafter, an etching process is performed on the oxide material to expose the source/drain regions between the gate electrodes. Unfortunately, the spacers are exposed to this contact etch process which can lead to undesirable amounts of spacer material loss and possible exposure of the gate structure. On the other hand, if the oxide material is formed before the spacers are formed adjacent the gate structure, so as to avoid damage to the spacers, other problems are presented. First, there is potential damage to the gate structure when the contact opening is formed since it is not protected by a spacer. Second, if a spacer is formed after the contact opening is formed, there is no protection for the gate structure in the areas that do not correspond to the contact opening. Thus, there would be a high likelihood of exposing portions of the unprotected gate structures during subsequent processing and potentially creating short circuits. One possible remedy to avoid the potential formation of such undesirable epi material would be to simply increase spacing between devices and increase gate pitches. However, such a "solution" would lead to reduced packing densities, which is counter to the ongoing trend in the industry now and for the foreseeable future.

The present disclosure is directed to various methods of forming an epi semiconductor material in trenches formed above a semiconductor device and the resulting semiconductor devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming an epi semiconductor material in trenches formed above a semiconductor device and the resulting semiconductor devices. One illustrative method disclosed includes, among other things, forming a gate structure above an active region of a semiconductor substrate, wherein a first portion of the gate structure is positioned above the active region and second portions of the gate structure are positioned above an isolation region formed in the substrate, forming a sidewall spacer adjacent opposite sides of the first portion of the gate structure so as to define first and second continuous epi formation trenches comprised of the spacer that extend for less than the axial length of the gate structure, wherein the first epi formation trench is positioned above at least a portion of the source region and the second epi formation trench is positioned above at least a portion of the drain region, and forming an epi semiconductor material on the active region within each of the first and second continuous epi formation trenches.

Another illustrative method disclosed herein includes, among other things, forming a gate structure above an active region of a semiconductor substrate, the gate structure having sidewalls and opposing end surfaces, wherein a first portion of the gate structure is positioned above the active region and second portions of the gate structure are positioned above an isolation region formed in the substrate, forming an etch stop liner on the sidewalls and the end surfaces of the entire gate structure, removing the portions of the etch stop layer positioned on the first portion of the gate structure while leaving the etch stop layer positioned on the second portions of the gate structure, forming a sidewall spacer adjacent opposite sides of the first portion of the gate structure so as to define first and second continuous epi formation trenches comprised of the spacer, wherein the first epi formation trench is positioned above at least a portion of the source region and the second epi formation trench is positioned above at least a portion of the drain region, and forming an epi semiconductor material on the active region within each of the first and second continuous epi formation trenches.

One illustrative device disclosed herein includes, among other things, a gate structure positioned above an active region of a semiconductor substrate, wherein a first portion of the gate structure is positioned above the active region and second portions of the gate structure are positioned above an isolation region formed in the substrate, first and second continuous epi formation trenches that extend for less than the axial length of the gate structure, wherein the first epi formation trench is positioned above at least a portion of the source region and the second epi formation trench is positioned above at least a portion of the drain region, and an epi semiconductor material positioned on the active region within each of the first and second continuous epi formation trenches.

BRIEF DESCRIPTION OF THE DRAWINGS

The disclosure may be understood by reference to the following description taken in conjunction with the accompanying drawings, in which like reference numerals identify like elements, and in which:

FIGS. 2A-2M depict various illustrative methods disclosed herein of forming epi semiconductor material in trenches formed above a semiconductor device and the resulting semiconductor devices.

Figure 1A:
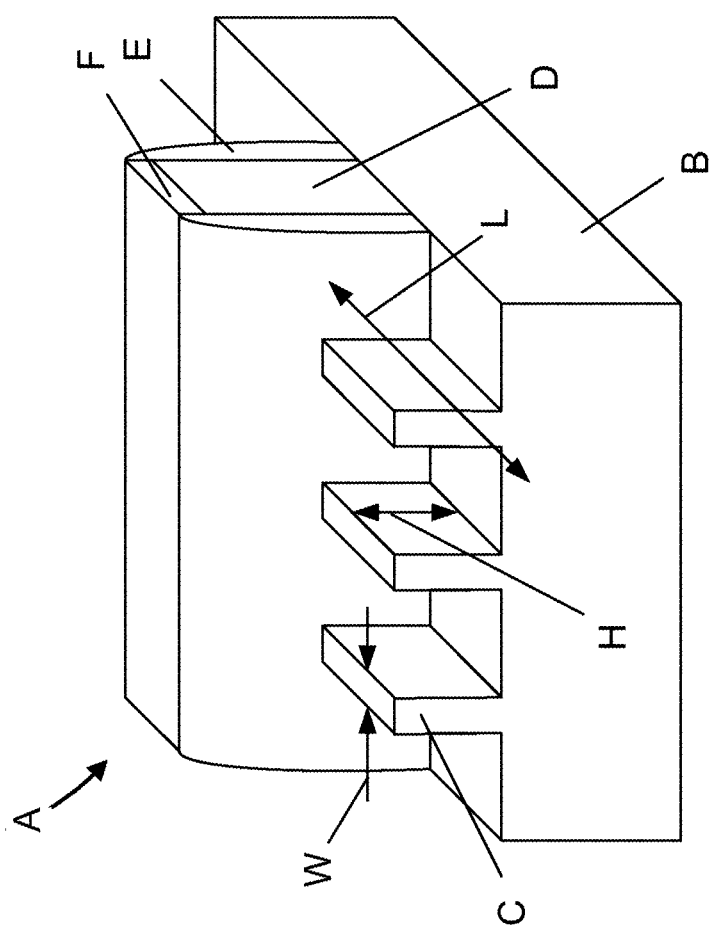
FIG. 1A is a perspective view of one illustrative embodiment of a prior art FinFET device.
Figure 1B:
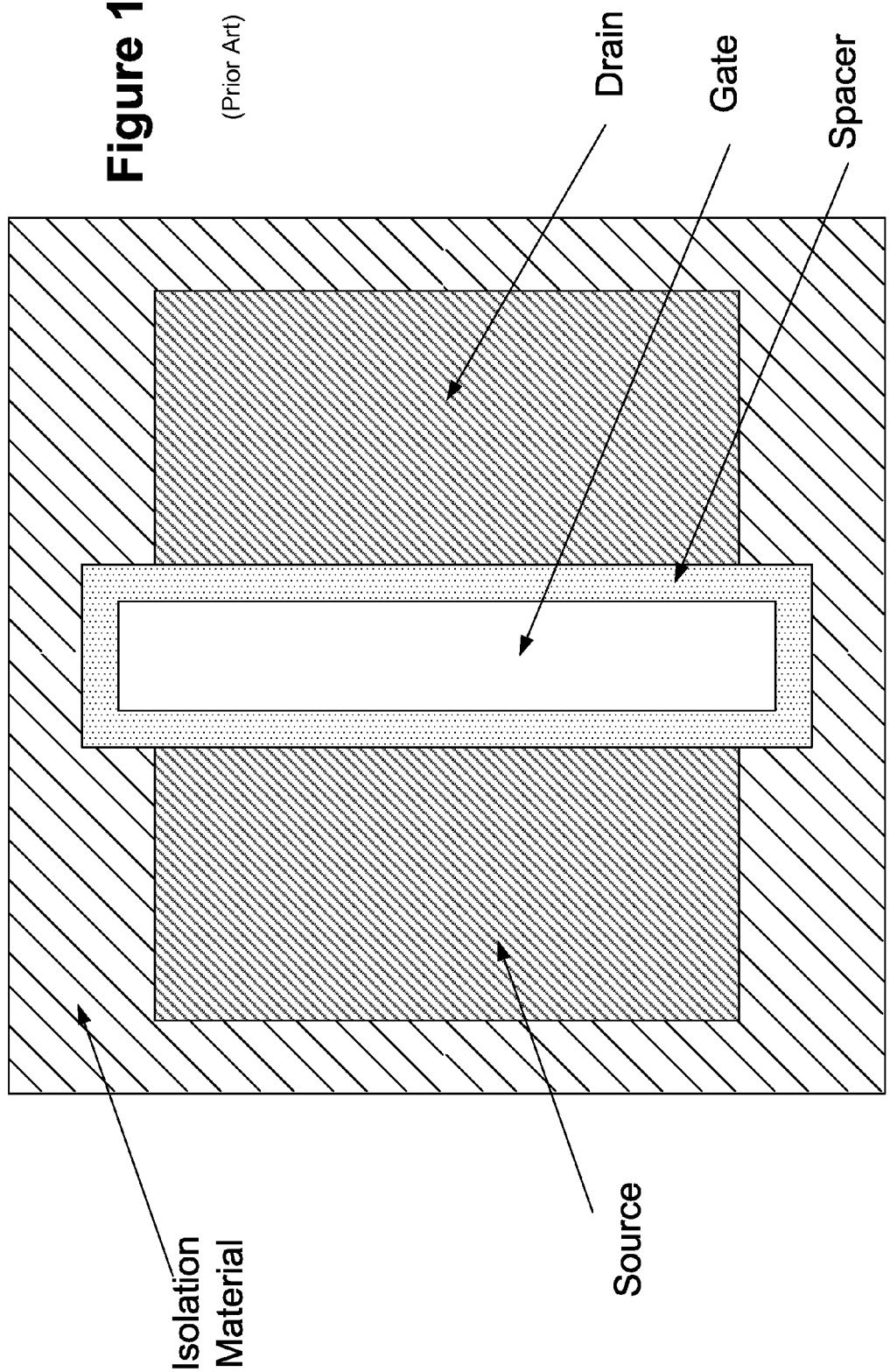
FIG. 1B is a plan view of an illustrative prior art transistor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming an epi semiconductor material in trenches formed above a semiconductor device and the resulting semiconductor devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. With reference to the attached figures, various illustrative embodiments of the methods and devices disclosed herein will now be described in more detail.

In one embodiment, the illustrative device 100 will be formed in and above the semiconductor substrate 102, having a bulk configuration. The device 100 may be either an NMOS or a PMOS transistor. Additionally, various doped regions, e.g., source/drain regions, halo implant regions, well regions and the like, are not depicted in the attached drawings. The substrate 102 may be made of silicon or it may be made of materials other than silicon. Thus, the terms "substrate" or "semiconductor substrate" should be understood to cover all semiconducting materials and all forms of such materials.

As will be appreciated by those skilled in the art after a complete reading of the present application, the methods and structures disclosed herein may be used when forming either planar or 3D transistor devices. An illustrative device 100 in the form of a 3D, FinFET device 100 will be depicted for purposes of disclosing the subject matter set forth herein. Additionally, various doped regions, e.g., source/drain regions, halo implant regions, well regions and the like, are not depicted in the attached drawings. Of course, the inventions disclosed herein should not be considered to be limited to the illustrative examples depicted and described herein. Moreover, the transistor devices that are depicted in the attached drawings may be either NMOS or PMOS devices. The various components and structures of the device 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

Figure 2A:
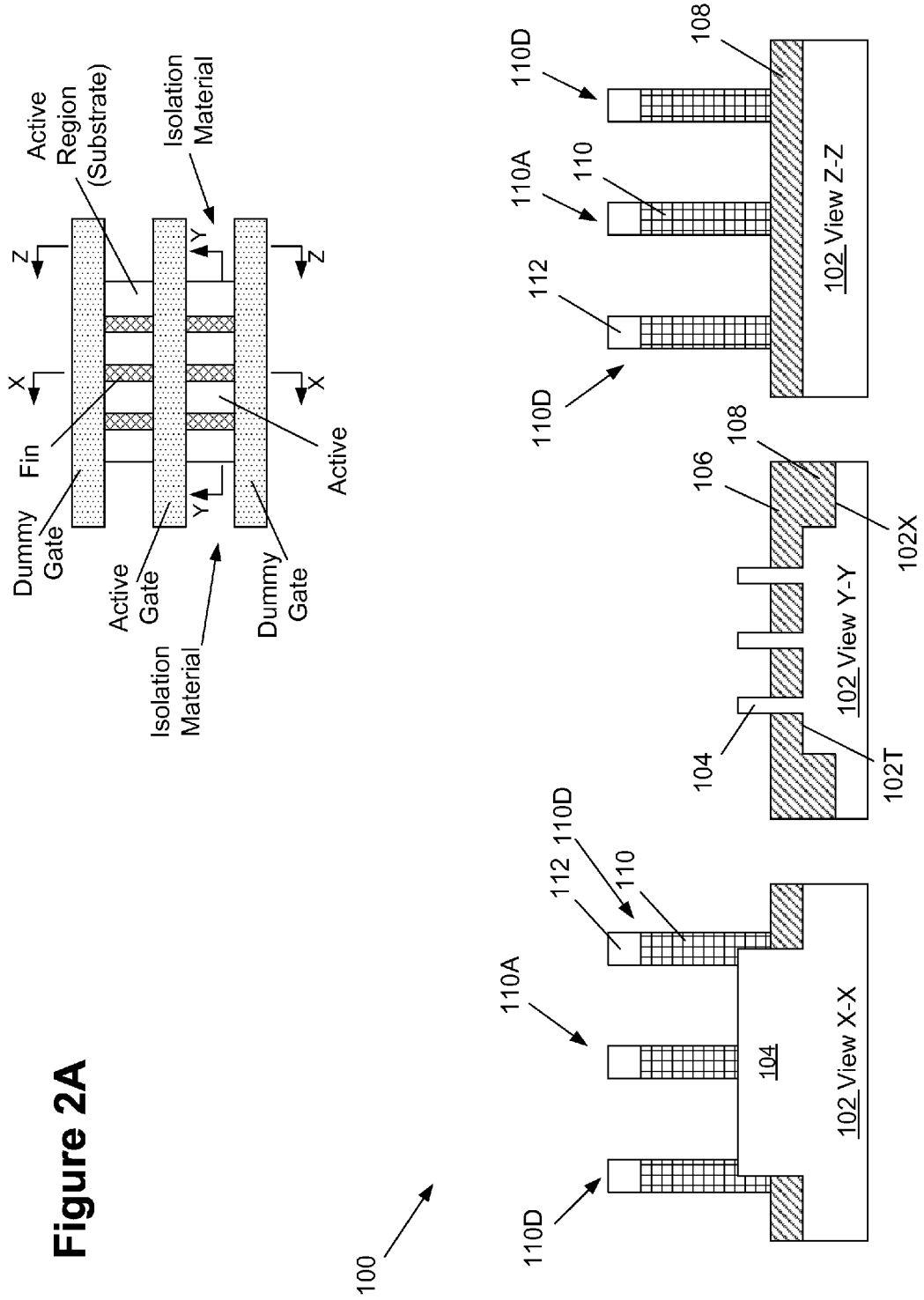

As shown in a simplistic plan drawing shown in the upper right corner of FIG. 2A only, the view "X-X" is a cross-sectional view taken along the long axis of the of an illustrative fin, i.e., a cross-sectional view along the long axis of the fin through the gate structure in the gate-length direction (current transport direction) of the transistor device 100; the view "Y-Y" is a cross-sectional view that is taken through the source/drain regions of the device 100 in the gate-width direction of the device 100; and the view "Z-Z" is a cross-sectional view taken through the portions of the gate structures (in a direction parallel to the current transport direction of the device) that are positioned above the isolation material that surrounds the active region when the device is completed.

FIG. 2A depicts the device after several process operations were performed. First, one or more etching processes, e.g., anisotropic etching processes, were performed through a patterned etch mask (not shown) to define a plurality of fin-formation trenches 102T in the substrate 102. The formation of the trenches 102T results in the formation of a plurality of fin structures 104. Deeper trenches 102X may also be formed in the substrate 102 before the formation of the trenches 102T. Thereafter, a recessed layer of insulating material 106, such as a layer of silicon dioxide, was formed in the trenches 102T between the fins 104 and in the trenches 102X. In one illustrative embodiment, the recessed layer of insulating material 106 may be formed by blanket depositing the initial layer of insulating material across the device so as to over-fill the trenches 102T, 102X. Thereafter, an optional chemical mechanical polishing (CMP) process may be performed to planarize the upper surface of the layer of material 106. Then, a timed, recessing etch-back process may be performed on the layer of insulating material to recess the upper surface of the layer of insulating material 106 to the desired height level, thereby exposing a desired amount of the fins 104 above the recessed layer of insulating material 106. These operations also result in the formation of an isolation region 108. The layer of material 106 may be comprised of a variety of different materials, such as silicon dioxide, etc., and it may be formed by performing a variety of techniques, e.g., chemical vapor deposition (CVD), etc.

The width and height of the fin structures 104 as well as the depth of the trenches 102T may vary depending upon the particular application. Additionally, the overall size, shape and configuration of the fin-formation trenches 102T and fins 104 may vary depending on the particular application. In the illustrative examples depicted in the attached drawings, the fin-formation trenches 102T and fins 104 are all depicted as having a uniform size and shape. However, such uniformity in the size and shape of the fin-formation trenches 102T and the fins 104 is not required to practice at least some aspects of the inventions disclosed herein. In the attached figures, the fin-formation trenches 102T are depicted as having been formed by performing an anisotropic etching process that results in the fin-formation trenches 102T having a schematically depicted, generally rectangular configuration. In an actual real-world device, the sidewalls of the fin-formation trenches 102T may be somewhat inwardly tapered, although that configuration is not depicted in the attached drawings. In some cases, the fin-formation trenches 102T may have a reentrant profile (not shown) near the bottom of the fin-formation trenches 102T. To the extent the fin-formation trenches 102T are formed by performing a wet etching process, the fin-formation trenches 102T may tend to have a more rounded configuration or non-linear configuration as compared to the generally rectangular configuration of the fin-formation trenches 102T that are formed by performing an anisotropic etching process. Thus, the size and configuration of the fin-formation trenches 102T, and the manner in which they are made, as well as the general configuration of the fins 104, should not be considered a limitation of the present invention. For ease of disclosure, only the substantially rectangular fin-formation trenches 102T and fins 104 will be depicted in the subsequent drawings. Moreover, the device 100 may be formed with any desired number of fins 104.

With continuing reference to FIG. 2A, three illustrative, and schematically depicted, sacrificial gate structures 110 are formed above a substrate 102. An illustrative gate cap layer 112 is also positioned above the sacrificial gate structures 110. As indicated, only one of the gate structures 110A will be used to form a single active gate structure above the active region 102. The other depicted gates structures 110D are "dummy" gate structures as it relates to the formation of the device 100 above the active region 102. Of course, these "dummy" gate structures may be used to form active gate structures above other active regions (not shown) defined in the substrate 102. The sacrificial gate structures 110 are intended to be representative in nature of any type of sacrificial gate structure that may be employed in manufacturing integrated circuit products using so-called gate-last (replacement gate) manufacturing techniques. In general, the sacrificial gate structures 110 are comprised of a sacrificial gate insulation layer (not separately depicted), such as silicon dioxide, and a sacrificial gate electrode (not separately depicted), such as polysilicon or amorphous silicon. In one illustrative replacement gate manufacturing technique, the layers of material for the sacrificial gate structure including a gate cap layer are initially formed/deposited above the substrate 102 and thereafter patterned using traditional masking and etching techniques to thereby define the sacrificial gate structure 110 with a gate cap layer 112 positioned above the sacrificial gate structure 110.

Figure 2B:
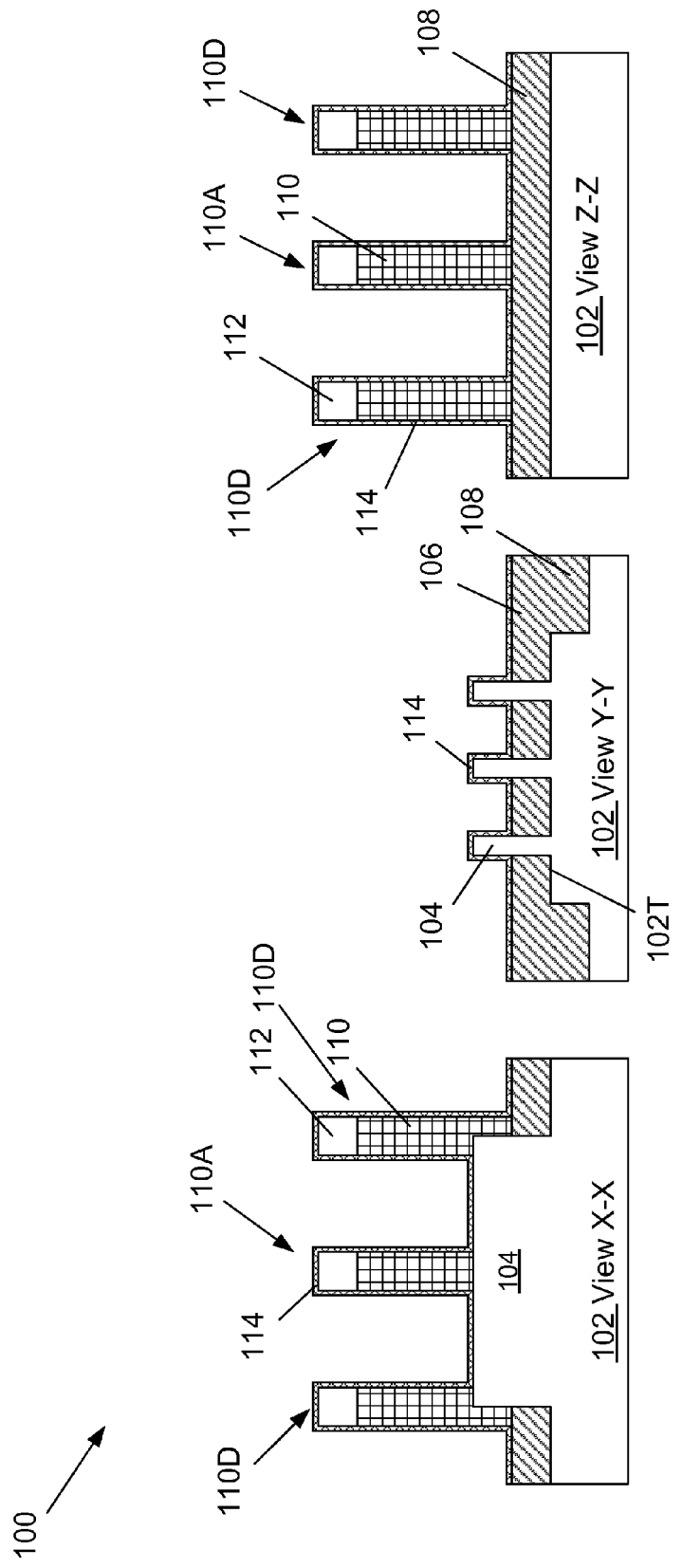

FIG. 2B depicts the device 100 after a conformal etch stop layer 114 was formed across the device 100. The etch stop layer 114 may be comprised of a variety of different materials depending upon the particular application. In one illustrative embodiment, the etch stop layer 114 may be comprised of a high-k material, e.g., a material having a dielectric constant equal to 9 or greater, such as hafnium oxide or aluminum oxide, etc. The etch stop layer 114 may be formed to any desired thickness, e.g., 2-5 nm.

Figure 2C:
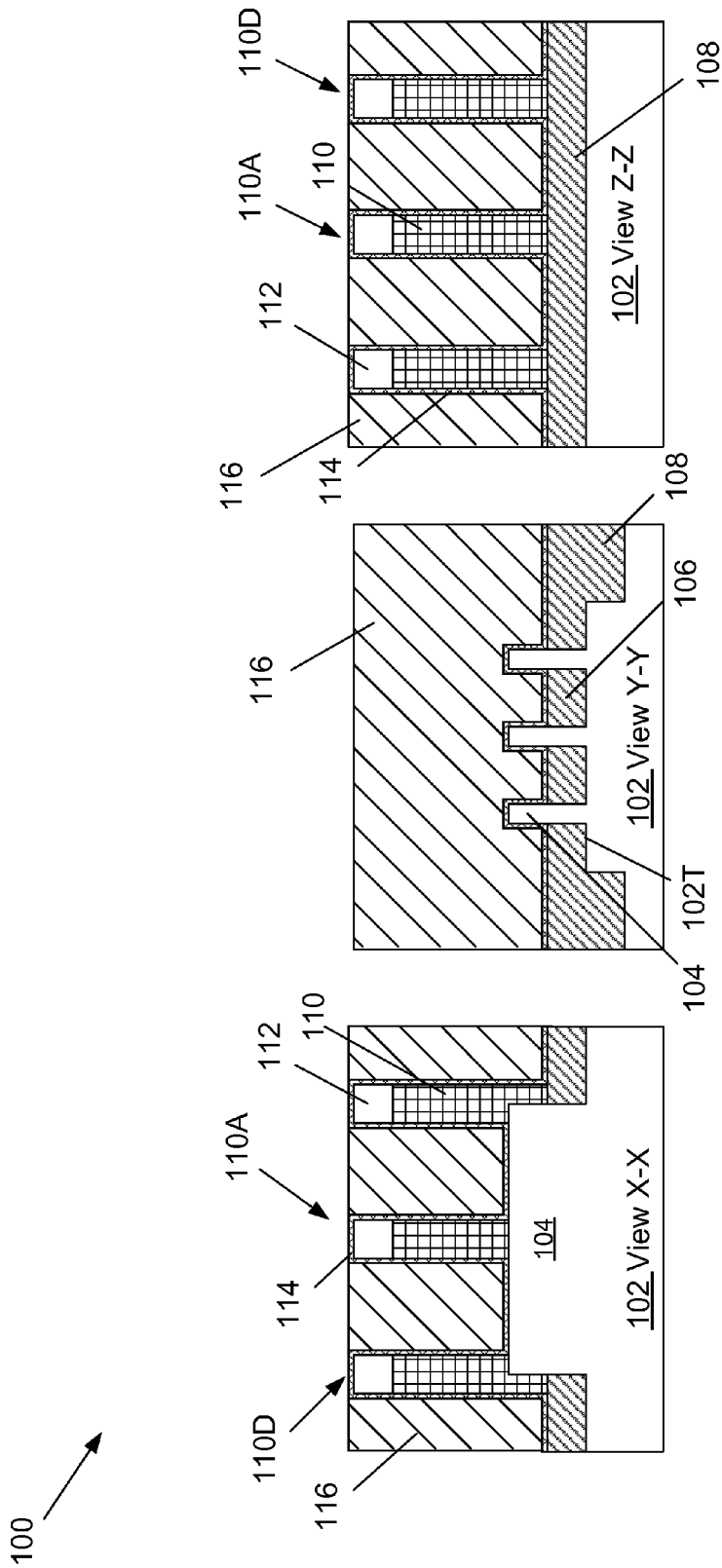

FIG. 2C depicts the product 100 after a layer of insulating material 116 has been deposited across the product 100 and after a CMP process was performed that stops on the etch stop layer 114. The layer of insulating material 116 may be comprised of a variety of different materials, such as silicon dioxide, etc., and it may be formed by performing a variety of techniques, e.g., CVD, etc.

Figure 2D:
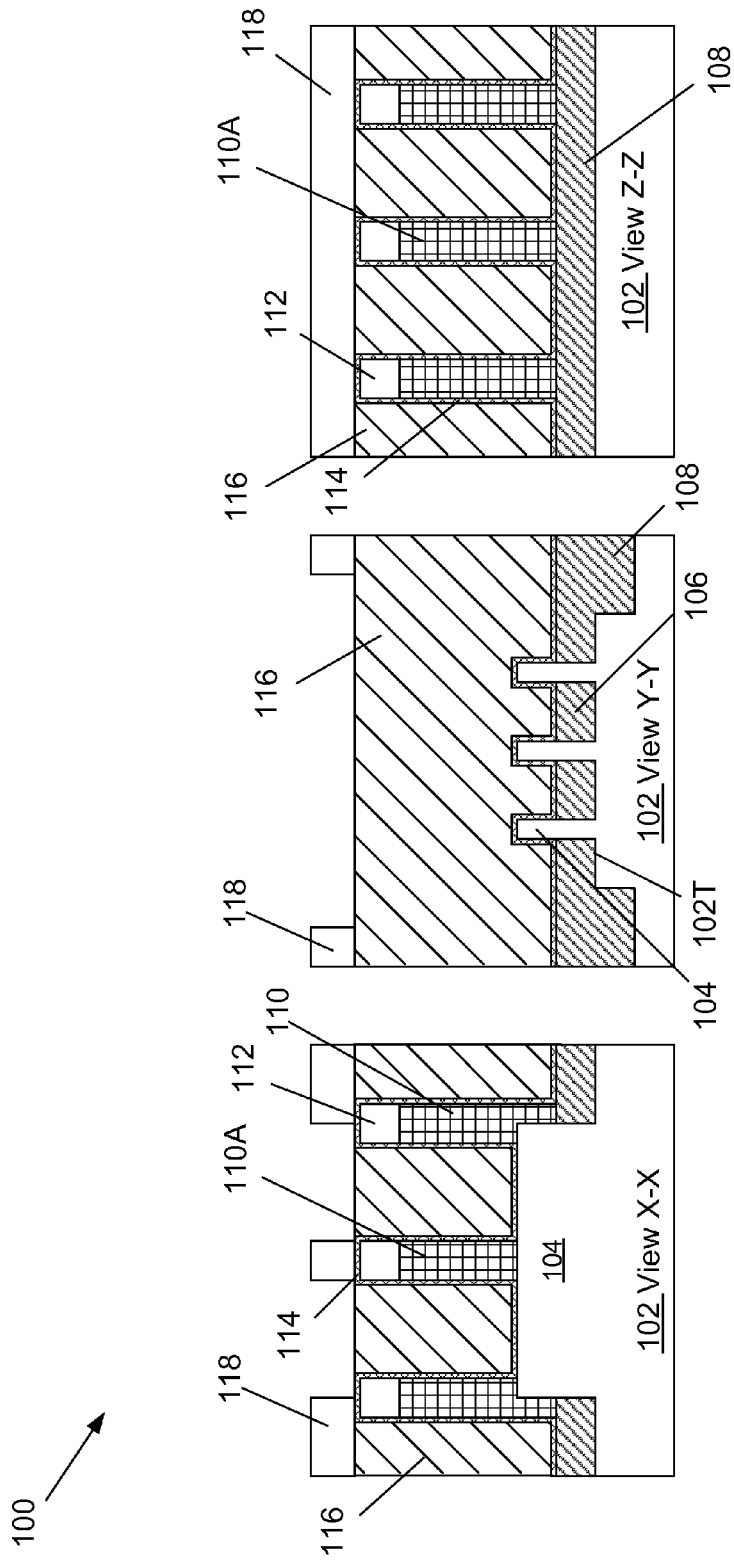

FIG. 2D depicts the device 100 after a patterned masking layer 118, e.g., a patterned layer of photoresist material, was formed above the substrate 102 using known photolithographic tools and techniques. Note that the patterned masking layer 118 covers the portions of the gate structures 110 that are positioned above the isolation region 108, including the active sacrificial gate structure 110A. See view Z-Z.

Figure 2E:
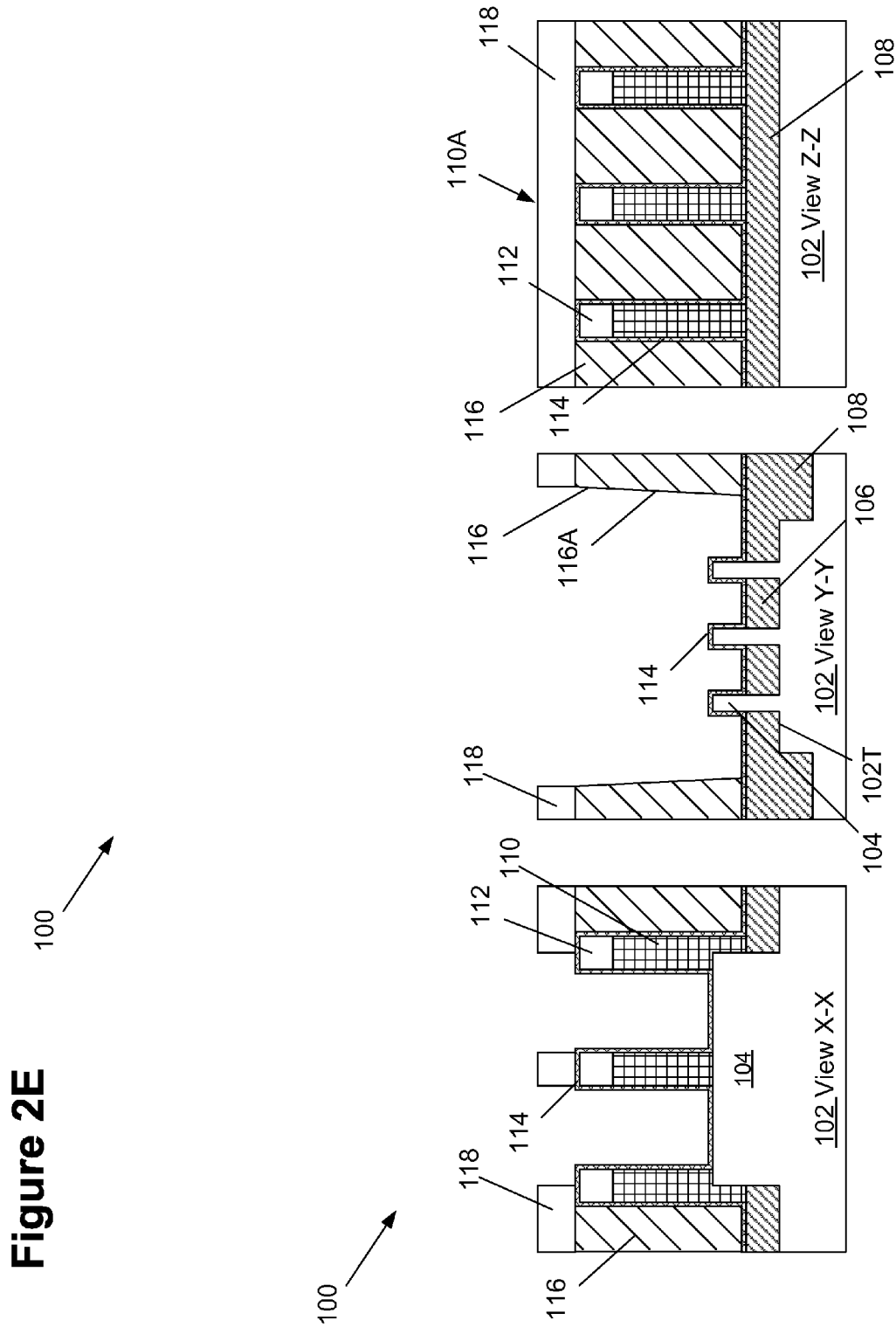

FIG. 2E depicts the product 100 after one or more etching processes were performed through the patterned mask layer 118 to remove exposed portions of the layer of insulating material 116. This etching process stops on the etch stop layer 114. This etching process defines an opening 116A in the layer of insulating material 116. See view Y-Y.

FIG. 2F depicts the product 100 after the patterned mask layer 118 was removed and after an etching process was performed to remove exposed portions of the etch stop layer 114. FIG. 2F contains a plan view of the view X-X. There are several things to note with respect to the plan view. First, in the depicted example, the active sacrificial gate structure 110A has been cut to its final desired axial length (in the gate width direction of the device), while the two dummy sacrificial gate structures continue to extend axially in the depicted view. As depicted, portions of the active gate structure 110A in the dashed-circle area 121 extend beyond the active region and are positioned above the isolation region 108. Thus, the etch stop layer 114 is formed on the sidewalls and cut end surface of the portion of the active gate structure 110A in the dashed-circle area 121. See view Z-Z as well. Also note that the etch stop layer 114 is still positioned adjacent the portions of the gate structures 110 that are positioned above the isolation region 108, but is has been removed from the portions of the gate structures within the opening 116A in the layer of insulating material 116.

FIG. 2G depicts the device 100 after sidewall spacers 120 were formed adjacent the exposed portions of the sacrificial gate structures 110 and on the layer of insulating material 116 in the opening 116A formed therein. The spacers 120 may be made from a variety of different materials, e.g., silicon nitride, a low-k material (k value less than about 6,such as SiCN, etc.). Note that the spacers 120 are not formed adjacent the portions of the gate structures 110 in the dashed-circle area 121, i.e., they are not formed adjacent the portions of the gate structures 110 that are positioned above the isolation region 108. The spacers 120 define a continuous spacer-lined epi formation trench 120T positioned on opposite sides of the gate structure 110 that will contain epi semiconductor material (not shown) that will be formed on the fins 104 in the source/drain regions of the device 100, as described more fully below. The spacers 120 were formed by conformably depositing a layer of spacer material and thereafter performing an anisotropic etching process to define the spacers 120. The spacers 120 may be formed to any desired base width. If desired, more than one spacer may be formed to define the spacer-lined trench 120T. Also note that, since the spacers 120 were formed after the opening 116A was formed in the layer of insulating material 116, the spacers 120 were not subjected to attack during the formation of the opening 116A. This is unlike the prior art process flows wherein the spacers 120 are usually formed adjacent the gate structures 110 prior to the formation of the layer of insulating material and the opening therein to expose the fins 104.

Figure 2H:
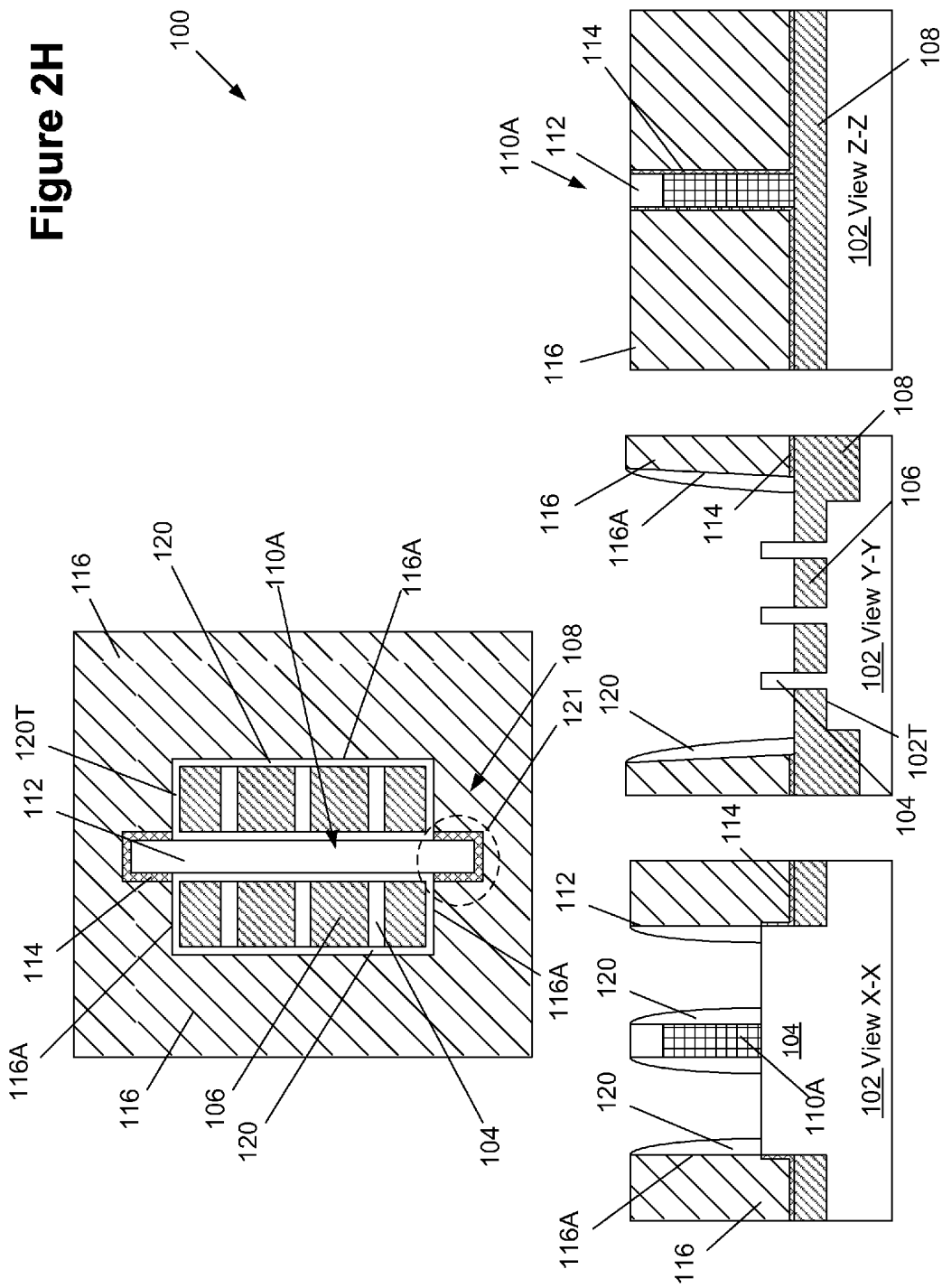

FIG. 2H depicts an alternative embodiment of the device 100 where only the active sacrificial gate structure 110A was formed above the active region, i.e., the dummy gate structures 110D are not present in FIG. 2H. In this case, the spacers 120 are formed on the exposed portions of the layer of insulating material 116 within the opening 116A. As depicted, the device 100 still comprises two spacer-lined epi formation trenches 120T positioned on opposite sides of the gate structure 110A. As with the other embodiment, the spacers 120 are not formed adjacent the portions of the gate structure 110A in the dashed-circle area 121, i.e., they are not formed adjacent the portions of the gate structure 110A that are positioned above the isolation region 108. For the remaining part of this application, the inventions disclosed herein will make reference to the example shown in FIG. 2G, i.e., where multiple gate structures 110 are formed above the active region.

FIG. 2I depicts the device 100 after a layer of epi semiconductor material 122, e.g., epi silicon, epi silicon-germanium, epi silicon-carbon, etc., was formed on the fins 104 within the spacer-lined epi formation trench 120T. Of course, in the case where the device 100 is a planar transistor device, the epi semiconductor material 122 would be formed on the upper surface of the substrate 102 or in recesses (not shown) formed in the substrate 102. The height or thickness 122H (view Y-Y) of the epi material 122 may vary depending on the particular application, e.g., 30-70 nm. Note that, since the epi material 122 is formed within the confined space defined by the spacer-lined epi formation trench 120T, the epi material 122 will not grow into undesired locations as was an issue when using prior art manufacturing techniques. Additionally, the epi material 122 may be formed too much greater thicknesses than was possible using prior art manufacturing techniques. For example, by forming the epi material 122 in the spacer-lined epi formation trench 120T, the epi material 122 will not grow and contact epi material grown on adjacent active regions. If desired, metal silicide regions (not shown) may be formed on top of the epi material 122 at this point in the process flow using traditional manufacturing techniques.

Figure 2J:
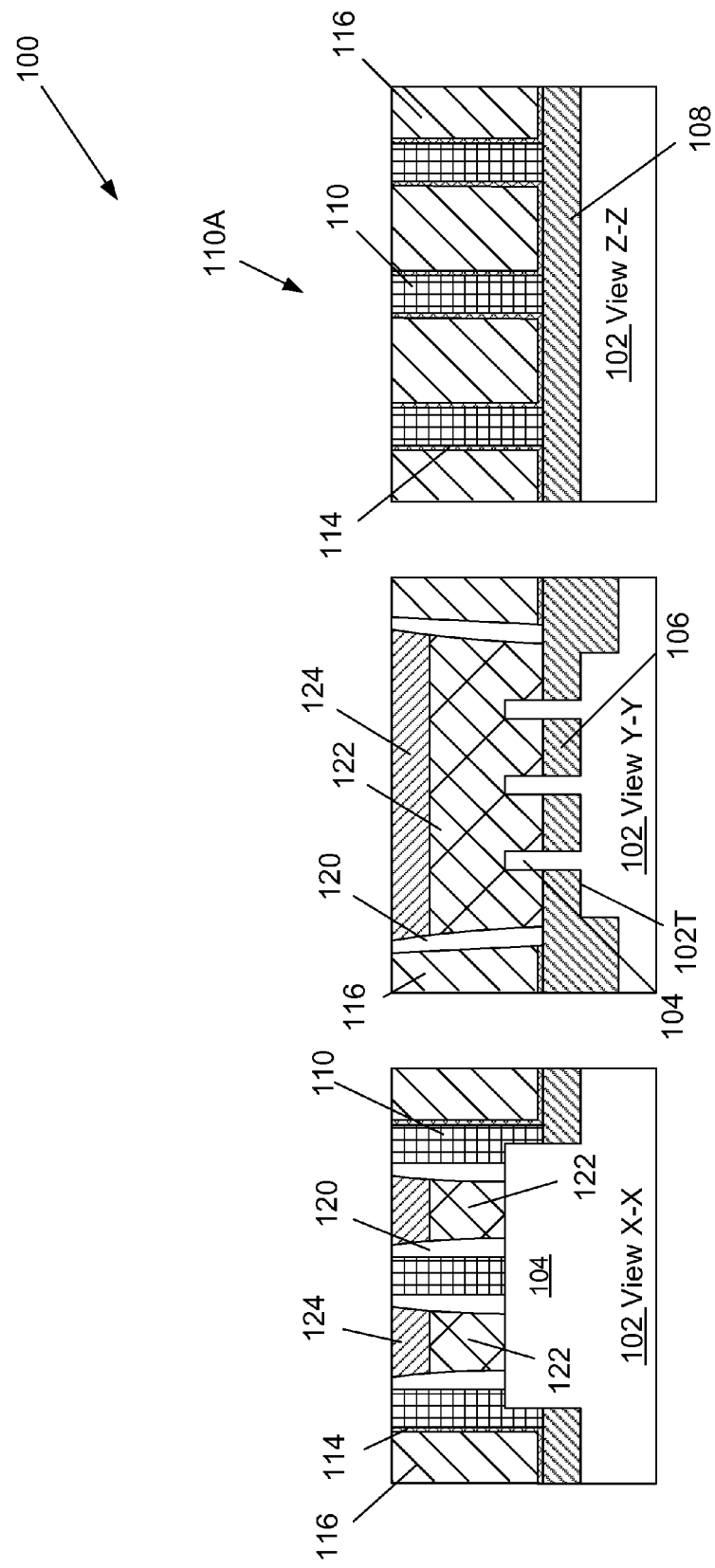

FIG. 2J depicts the device 100 after several process operations were performed. First, a layer of insulating material 124, e.g., silicon dioxide, was blanket-deposited across the entire device 100 and above the epi semiconductor material 122. Thereafter, a CMP process was performed to planarize the upper surface of the layer of insulating material 124 with the upper surface of the sacrificial gate electrode or the sacrificial gate structures 110. The CMP process results in the removal of the gate cap layers 112.

Figure 2K:
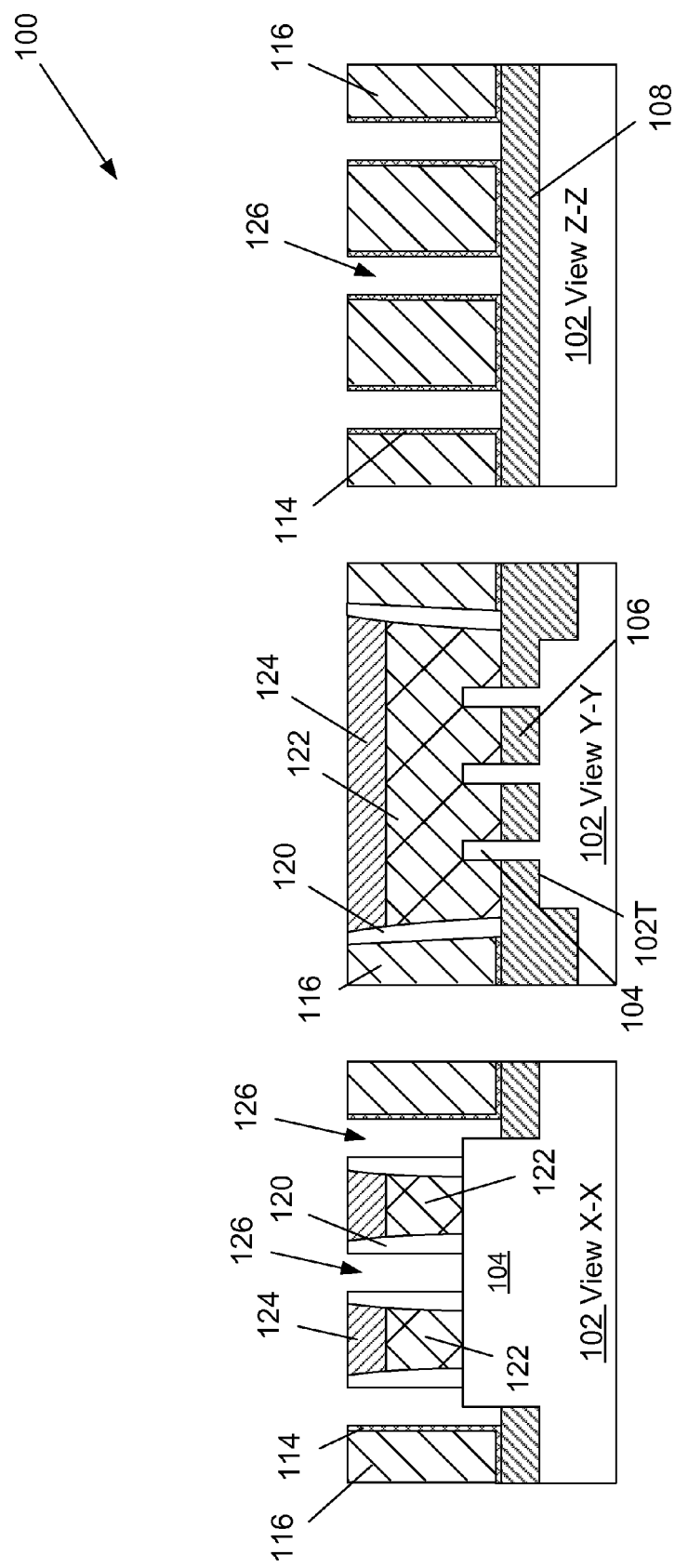

FIG. 2K depicts the device 100 after one or more etching processes were performed to remove the sacrificial gate structures 110 which results in the formation of a replacement gate cavity 126 that is laterally defined by the spacers 120 where the final replacement gate structure for the device 100 will be formed. Note that, for the portions of the gates structures positioned above the isolation region 108 (see view Z-Z), the gate cavity 126 is defined by the etch stop layer 114. At this point, due to the presence of the etch stop layer 114, the covered portions of the insulation material 116 are not subjected to attack during the process of removing the sacrificial gate structures 110.

Figure 2L:
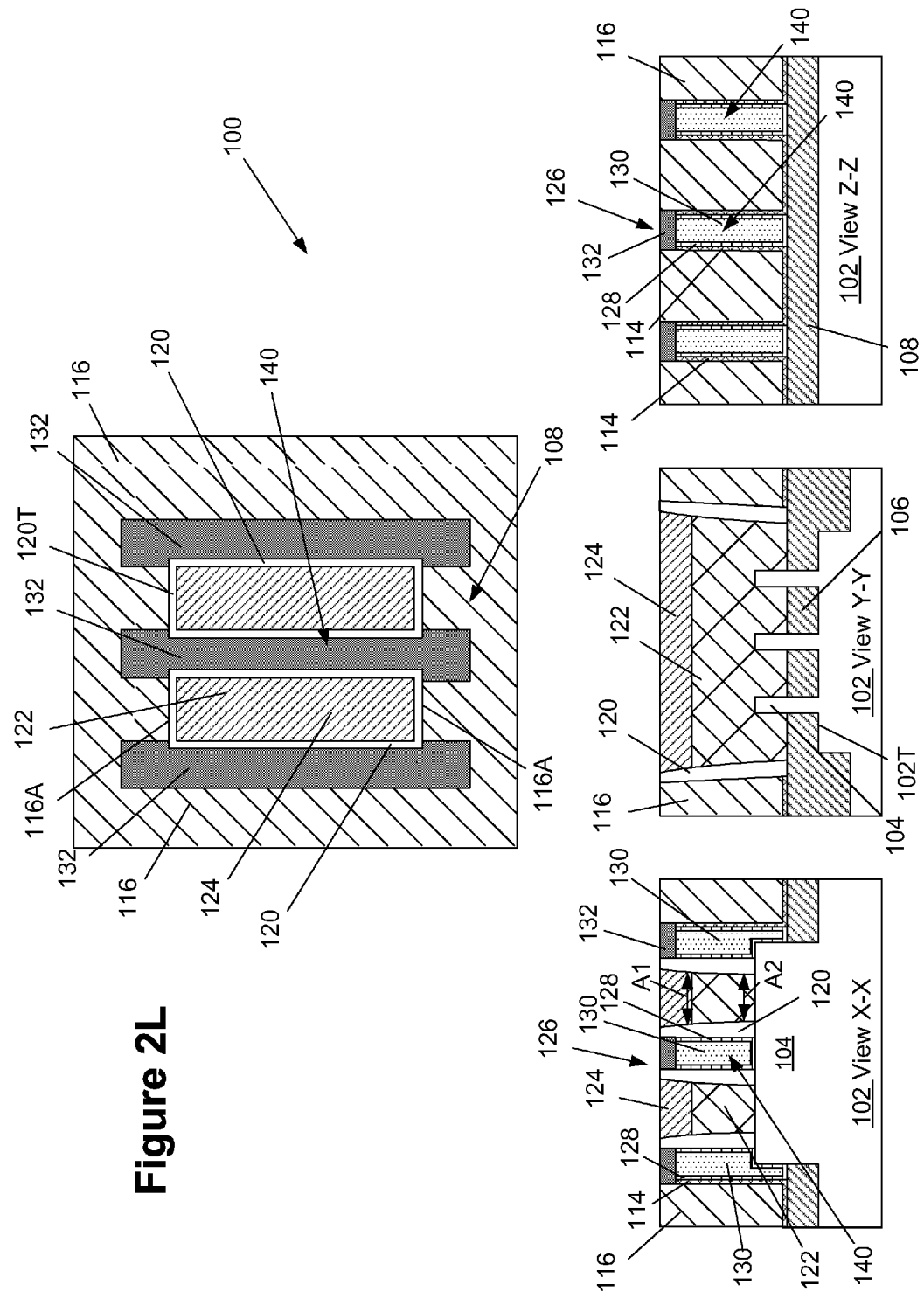

FIG. 2L depicts the device 100 after several process operations were performed that ultimately results in the formation of an illustrative and schematically depicted replacement (or final) gate structure 140 in the gate cavity 126, and the formation of a gate cap layer 132 above the replacement gate structure 140. Of course, as noted above, at least some of the presently disclosed inventions may be employed in cases where the gate structure for the device 100 is formed using either replacement gate techniques or so-called gate first manufacturing techniques. Thus, the presently disclosed inventions should not be considered to be limited to any particular type of gate structure or the manner in which it is made. The replacement gate structure 140 depicted herein is intended to be representative in nature of any type of gate structure that may be employed in manufacturing integrated circuit products.

Typically, in a replacement gate process flow, a pre-clean process will be performed in an attempt to remove all foreign materials from within the gate cavity 126 prior to forming the various layers of material that will become part of the gate structure 140. For example, the gate structure 140 may be formed by sequentially depositing the materials of the gate structure 140 in the gate cavity 126 and above the layer of material 124, performing a CMP process to remove excess materials above the layer 124 and then performing an etch-back recess etching process such that the upper surface of the gate structure 140 is at the desired height level. At that point, the material of the gate cap layer 132 may be deposited across the device and above the recessed gate structure 140, and another CMP process may be performed to remove excess material from above the layer of insulating material 124 so as to thereby define the gate cap layers 132. With continuing reference to FIG. 2L, as one specific example, the gate structure 140 may include a high-k (k value greater than 10) gate insulation layer 128, such as hafnium oxide, that is deposited across the device 100 and within the gate cavity 126 on the portion of the fin 104 exposed by the gate cavity 126 by performing a conformal deposition process, i.e., an ALD or CVD deposition process. If desired, a thin interfacial layer of silicon dioxide (not shown) may be formed prior to the formation of the high-k gate insulation layer 128. Next, various schematically depicted conductive materials 130 may be formed in the gate cavity 126 above the high-k gate insulation layer 128. The conductive materials 130 may comprise at least one work function adjusting metal layer (not separately shown), e.g., a layer of titanium nitride or TiAlC, depending upon the type of transistor device being manufactured, that is deposited on the high-k gate insulation layer 128 and within the gate cavity 126 by performing a conformal ALD or CVD deposition process. Of course, more than one layer of work function metal may be formed in the gate cavity 126, depending upon the particular device under construction. Then, a bulk conductive material, such as tungsten or aluminum, may be deposited in the gate cavity 126 above the work function adjusting metal layer(s). Thereafter, the above-described CMP process was performed to remove excess portions of the various layers of material positioned above the surface of the layer of insulating material 124. Next, a recess etching process was performed so as to remove a desired amount of the materials of the gate structure 140 to make room for the gate cap layer 132. The gate cap material is then deposited and another CMP process is performed to form the depicted gate cap layers 132. At this point in the process flow, traditional manufacturing operations may be performed to complete an integrated circuit product that includes the device 100, e.g., formation of source/drain and gate contacts, formation of various metallization layers, etc.

Figure 2M:
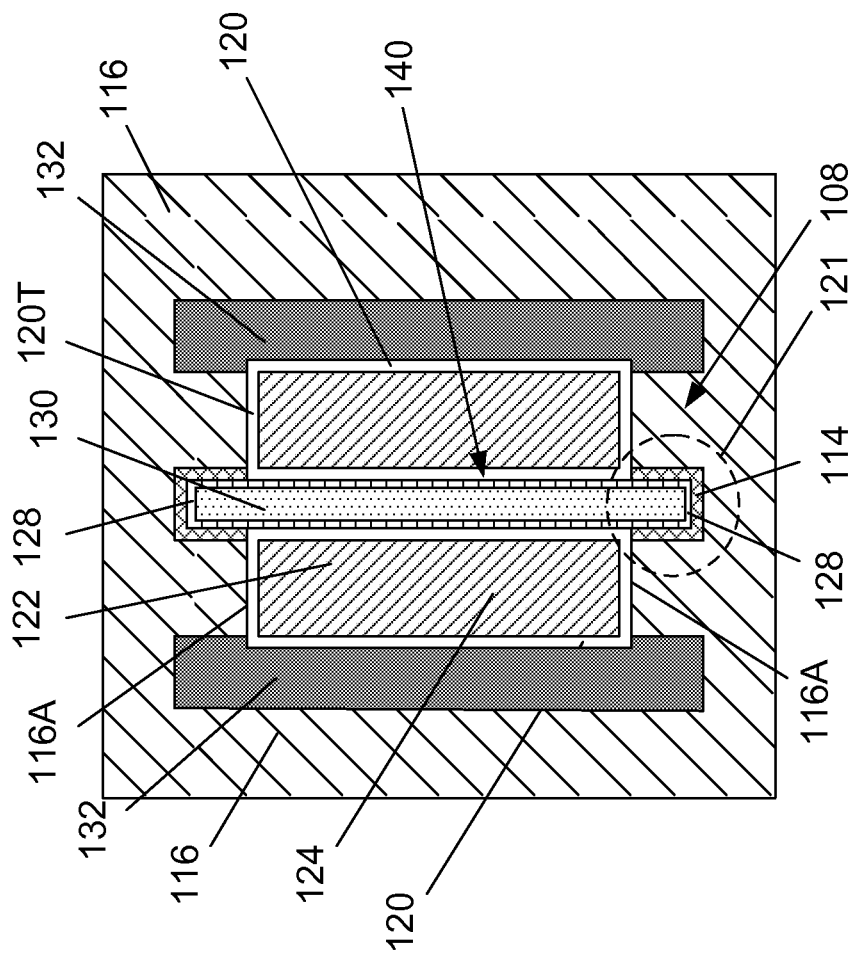

FIG. 2M depicts the plan view in FIG. 2L with the gate cap layer 132 removed from only the active gate structure 140 so as to better reveal relationship between the etch stop layer 114 and the gate insulation layer 128 formed adjacent the portions of the gate electrode that are positioned above the active region 108. As will be appreciated by those skilled in the art after a complete reading of the present application, a novel transistor device has been disclosed herein. More specifically, with reference to FIGS. 2L and 2M, the spacers 120, i.e., the two continuous epi formation trenches 120T, do not extend along the entire axial length (in the gate width direction of the device) of the active gate structure 140. Rather, the etch stop liner 114 and the high-k gate insulation layer 128 are positioned adjacent the sidewalls and the end surfaces of the portions of the active gate structure 140 that are positioned above the isolation region 108. This dual-layer combination, i.e., the layers 114 and 128, along with the spacers 120, serve to protect these portions of the gate structure 140 during subsequent processing operations. Additionally, the epi semiconductor materials 122 are positioned within the inner perimeter of the spacer-lined epi formation trenches 120T. That is, all lateral edges of the epi semiconductor material 122 are laterally enclosed by the spacer-lined epi formation trenches 120T.

As noted above, the methods disclosed herein allow for the formation of the epi semiconductor material 122 to much greater thicknesses or height than was possible using prior art techniques. This provides many significant advantages as compared to prior art devices. For example, the additional epi thickness provides for a greater contact area "A1" (see FIG. 2L) as compared to the contact area "A2" when the epi material had to be relatively thin to avoid the problems discussed in the background section of this application. The increased area makes contact formation easier. The increased epi thickness also provides for more volume of epi material, which makes the entire epi structure 122 more able to withstand contact gouging. The increased epi volume and thickness may also allow manufacturers to form profiles, e.g., recesses, in the epi material to further increase the contact area for metal silicide regions and/or contacts, as described in US patent application entitled "Methods of Increasing Silicide to Epi Contact Areas and the Resulting Devices" which identifies inventor Xie as the first named inventor of that application. The increased epi volume also enables the formation of thicker metal silicide regions so as to lower the contact resistance without fear of consuming all or substantially all of the epi material during the silicide formation process. Other advantages of the novel device and methods disclosed herein will be apparent to those skilled in the art after a complete reading of the present application.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a device comprised of a gate structure, a source region and a drain region that are positioned on opposite sides of said gate structure, wherein the method comprises:

forming said gate structure above an active region of a semiconductor substrate, said gate structure having an axial length in a gate width direction of said device, wherein a first portion of said gate structure is positioned above said active region and second portions of said gate structure are positioned above an isolation region formed in said substrate;

forming an etch stop layer on said gate structure, wherein said etch stop layer covers end surfaces and sidewall surfaces of said second portions of said gate structure but does not cover any sidewall surfaces of said first portion of said gate structure;

forming a sidewall spacer adjacent opposite sides of said first portion of said gate structure so as to define first and second epi formation trenches comprising said spacer and extending continuously along said first portion of said gate structure for less than said axial length of said gate structure, wherein said first epi formation trench is positioned above at least a portion of said source region and said second epi formation trench is positioned above at least a portion of said drain region; and forming an epi semiconductor material on said active region within each of said first and second epi formation trenches.

2. The method of claim 1, wherein said first and second epi formation trenches are positioned adjacent said first portion of said gate structure but not adjacent said second portions of said gate structure.

3. The method of claim 1, wherein said device is one of a planar device or a FinFET device.

4. The method of claim 1, wherein said gate structure is one of a sacrificial gate structure or a final gate structure for said device.

5. The method of claim 1, wherein said first and second epi formation trenches have a height that is approximately equal to a combined height of said gate structure and a gate cap layer formed above said gate structure.

6. The method of claim 1, wherein said first and second epi formation trenches are in contact with first and second opposing sidewalls, respectively, of said gate structure.

7. The method of claim 1, wherein forming said sidewall spacer defining said first epi formation trench comprises forming a first portion of a first sidewall spacer adjacent a first sidewall on a source region side of said gate structure and forming a second portion of said first spacer adjacent a sidewall of a first dummy gate structure positioned laterally adjacent and spaced apart from said first sidewall on said source region side of said gate structure.

8. The method of claim 7, wherein forming said sidewall spacer defining said second epi formation trench comprises forming a first portion of a second sidewall spacer adjacent a second sidewall on a drain region side of said gate structure and forming a second portion of said second spacer adjacent a sidewall of a second dummy gate structure positioned laterally adjacent and spaced apart from said first sidewall on said drain region side of said gate structure.

9. The method of claim 1, wherein forming said sidewall spacer defining said first epi formation trench comprises forming a first portion of a first sidewall spacer adjacent a first sidewall on a source region side of said gate structure and forming a second portion of said first spacer adjacent a sidewall of a layer of insulating material that is laterally adjacent and spaced apart from said first sidewall on said source region side of said gate structure.

10. The method of claim 9, wherein forming said sidewall spacer defining said second epi formation trench comprises forming a first portion of a second sidewall spacer adjacent a second sidewall on a drain region side of said gate structure and forming a second portion of said second spacer adjacent a sidewall of a layer of insulating material that is laterally adjacent and spaced apart from said first sidewall on said drain region side of said gate structure.

11. The method of claim 1, wherein forming said etch stop layer comprises:
   forming a conformal layer of etch stop material that covers sidewall surfaces of said first portion of said gate structure and covers said end surfaces and said sidewall surfaces of said second portions of said gate structure; and
   performing one or more etching processes to remove said conformal layer of etch stop material from said sidewalls of said first portion of said gate structure.

12. A method of forming a device comprised of a gate structure, a source region and a drain region that are positioned on opposite sides of said gate structure, wherein the method comprises:
   forming said gate structure above an active region of a semiconductor substrate, said gate structure having sidewalls and opposing end surfaces, wherein a first portion of said gate structure is positioned above said active region and second portions of said gate structure are positioned above an isolation region formed in said substrate;
   forming an etch stop layer on said sidewalls and said end surfaces of an entirety of said gate structure;
   removing the portions of said etch stop layer positioned on said first portion of said gate structure while leaving said etch stop layer positioned on said second portions of said gate structure;
   forming a sidewall spacer adjacent opposite sides of said first portion of said gate structure so as to define first and second epi formation trenches comprising said spacer and extending continuously along said first portion of said gate structure, wherein said first epi formation trench is positioned above at least a portion of said source region and said second epi formation trench is positioned above at least a portion of said drain region; and
   forming an epi semiconductor material on said active region within each of said first and second epi formation trenches.

13. The method of claim 12, wherein said etch stop layer is comprised of a material having a dielectric constant equal to or greater than 9.

14. The method of claim 12, wherein said gate structure is a sacrificial gate structure and wherein the method further comprises:
   after forming said epi semiconductor material, removing said sacrificial gate structure so as to define a gate cavity;
   forming a gate insulation layer in said gate cavity and on said first and second epi formation trenches and on said first etch stop layer;
   forming conductive material in said gate cavity on said gate insulation layer;
   recessing said gate insulation layer and said conductive material within said gate cavity; and
   forming a gate cap layer within said gate cavity above said recessed gate insulation layer and above said recessed conductive material.

15. The method of claim 12, wherein said first and second epi formation trenches have a height that is approximately equal to a combined height of said gate structure and a gate cap layer formed above said gate structure.

16. The method of claim 12, wherein said first and second epi formation trenches are in contact with first and second opposing sidewalls, respectively, of said gate structure.

17. The method of claim 12, wherein forming said sidewall spacer defining said first epi formation trench comprises forming a first portion of a first sidewall spacer adjacent a first sidewall on a source region side of said gate structure and forming a second portion of said first spacer adjacent a sidewall of a first dummy gate structure positioned laterally adjacent and spaced apart from said first sidewall on said source region side of said gate structure.

18. The method of claim 17, wherein forming said sidewall spacer defining said second epi formation trench comprises forming a first portion of a second sidewall spacer adjacent a second sidewall on a drain region side of said gate structure and forming a second portion of said second spacer adjacent a sidewall of a second dummy gate structure positioned laterally adjacent and spaced apart from said first sidewall on said drain region side of said gate structure.

19. The method of claim 12, wherein forming said sidewall spacer defining said first epi formation trench comprises forming a first portion of a first sidewall spacer adjacent a first sidewall on a source region side of said gate structure and forming a second portion of said first spacer adjacent a sidewall of a layer of insulating material that is laterally adjacent and spaced apart from said first sidewall on said source region side of said gate structure.

20. The method of claim 19, wherein forming said sidewall spacer defining said second epi formation trench comprises forming a first portion of a second sidewall spacer adjacent a second sidewall on a drain region side of said gate structure and forming a second portion of said second spacer adjacent a sidewall of a layer of insulating material that is laterally adjacent and spaced apart from said first sidewall on said drain region side of said gate structure.

* * * * *